(12) United States Patent  
Livengood et al.

(10) Patent No.: US 7,141,439 B2  
(45) Date of Patent: Nov. 28, 2006

(54) TRANSISTOR-LEVEL SIGNAL CUTTING METHOD AND STRUCTURE

(75) Inventors: Richard H. Livengood, San Jose, CA (US); Darren Slawecki, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/045,523

(22) Filed: Jan. 28, 2005

(65) Prior Publication Data

US 2006/0170099 A1   Aug. 3, 2006

(51) Int. Cl.  
*H01L 21/00*   (2006.01)

(52) U.S. Cl. .......................... 438/4; 438/598

(58) Field of Classification Search ............... 438/4–7, 438/12–17, 128, 130, 598  
See application file for complete search history.

(56) References Cited

U.S. PATENT DOCUMENTS

| | | | |
|---|---|---|---|
| 5,904,486 A | 5/1999 | Livengood et al. | |
| 5,952,247 A | 9/1999 | Livengood et al. | |
| 5,976,980 A | 11/1999 | Livengood et al. | |
| 6,020,746 A | 2/2000 | Livengood | |
| 6,150,718 A | 11/2000 | Livengood et al. | |
| 6,153,891 A | 11/2000 | Livengood | |
| 6,159,753 A | 12/2000 | Winer et al. | |
| 6,309,897 B1 * | 10/2001 | Livengood | 438/14 |
| 6,448,095 B1 * | 9/2002 | Birdsley et al. | 438/12 |

* cited by examiner

*Primary Examiner*—Brook Kebede  
(74) *Attorney, Agent, or Firm*—Blakely, Sokoloff, Taylor & Zafman LLP

(57) ABSTRACT

A modifiable circuit structure and its method of formation are disclosed. The modifiable circuit structure electrically couples one portion of an interconnect with another portion of the interconnect through vias disposed in a dielectric layer. The combination of the modifiable circuit structure, the interconnect portions, and the vias provide a signal path between transistors in an integrated circuit. In one embodiment the modifiable circuit structure is a polysilicon feature formed over regions of a semiconductor substrate. In an alternative embodiment, the modifiable circuit structure is a diffusion region formed in region the semiconductor substrate.

25 Claims, 5 Drawing Sheets

TRANSISTOR-LEVEL SIGNAL CUTTING METHOD AND STRUCTURE

FIELD OF THE INVENTION

Embodiments of the present invention relate generally to the field of integrated circuit testing and more particularly a method and apparatus enabling circuit edits in an integrated circuit.

BACKGROUND OF THE INVENTION

The process of identifying and correcting problems in new integrated circuit (IC) designs is known as debugging. During debugging, it is sometimes necessary to edit (i.e., add, delete or reroute) signal line connections within the IC in order to optimize its performance. After debugging, optimized designs can be used to mass produce integrated circuits.

FIG. 1 shows a schematic illustration of how an IC 100 can be edited. Here, circuit block 102 is coupled to circuit block 104 by way of inverter 106. If during debugging it is determined that the signal from circuit block 102 should not be inverted when received by circuit block 106, then IC 100 can be edited by (1) cutting the signal line at point 114 to electrically remove inverter 106 from IC 100, and (2) coupling circuit block 102 to circuit block 104 at points 108 and 110 by way of jumper 112.

Prior art techniques for cutting signal lines to isolate circuitry include removing portions of a first level metal (M1) interconnect using a focused ion beam (FIB) milling tool. These techniques are discussed in U.S. Pat. No. 6,153,891, entitled "Method and Apparatus Providing A Circuit Edit Structure Through The Back Side of An Integrated Circuit," filed on Sep. 30, 1997, and assigned to the Assignee hereof. FIG. 2 illustrates a cross-sectional view 200 showing one way this can be done.

Shown in FIG. 2 is a cross-sectional view of a portion of an IC 200 that includes source/drain region 225 of transistor 226 and source/drain region 227 of transistor 228 (e.g., the output of the inverter 106 and input of circuit block 104 in FIG. 1) formed in semiconductor substrate 222 and separated by isolation region 224. First level (M1) interconnect 231 couples source/drain 225 to source/drain 227 by way of vias 229 formed in dielectric 230. Second level (M2) interconnects 233 can connect to M1 interconnect 231 through vias in some regions (not shown). In other regions, the M1 interconnect 231 is isolated from M2 interconnects 233 by way of interlayer dielectric 232. Layer 234, which can include any number of other conductors, insulators, etc., can overlie interlayer dielectric 232.

As shown in FIG. 2, the signal line 231 can be cut by milling a window opening 235 through the silicon substrate 222. After the window 235 is milled, portions of the isolation region 224, portions of the dielectric 230, and then portions of the first level interconnect 231 exposed by the window 135 are removed until a discontinuity 214 is created in M1 interconnect 231. The discontinuity 214 creates an electrical open (similar to the cut 114 schematically shown in FIG. 1) that electrically isolates source/drain region 225 from source/drain region 226.

The migration from aluminum to copper interconnects in state-of-the-art semiconductor processes has made the cutting process described in FIG. 2 problematic. More specifically, because copper does not easily volatilize, it is difficult to cut using FIB enhanced/assisted chemical etch tools, lasers, etc. This can result in failure to isolate existing circuitry (due to incomplete cuts) and copper redeposition that can produce shorts between adjacent interconnects (not shown). The FIB's energy can be increased to address this, however this reduces selectivity to the adjacent interlayer dielectric 232 and creates other problems. For example, now the loss in selectively in conjunction with the copper's low volatility can result in electrical shorts 236 between M1 interconnects 231 and M2 interconnect 233, as shown in FIG. 2.

Figure 1:
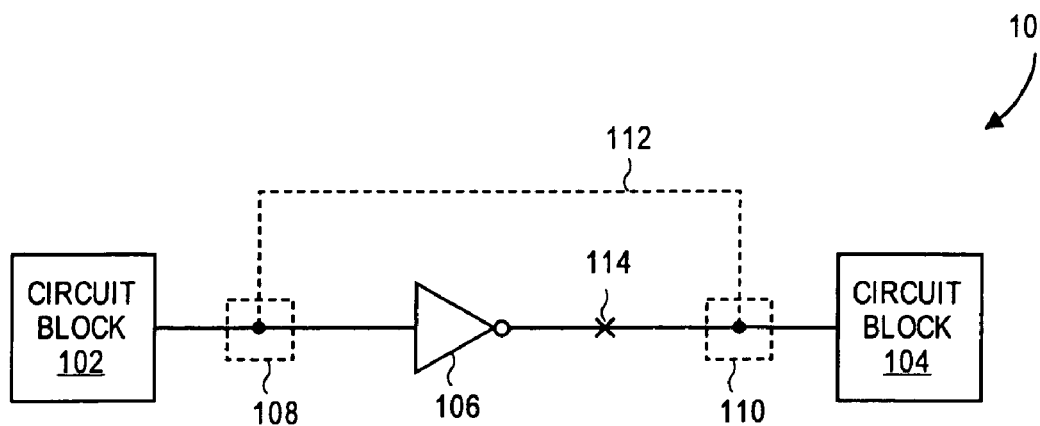
FIG. 1 illustrates schematic representation of a circuit edit being preformed on an integrated circuit.
Figure 2:
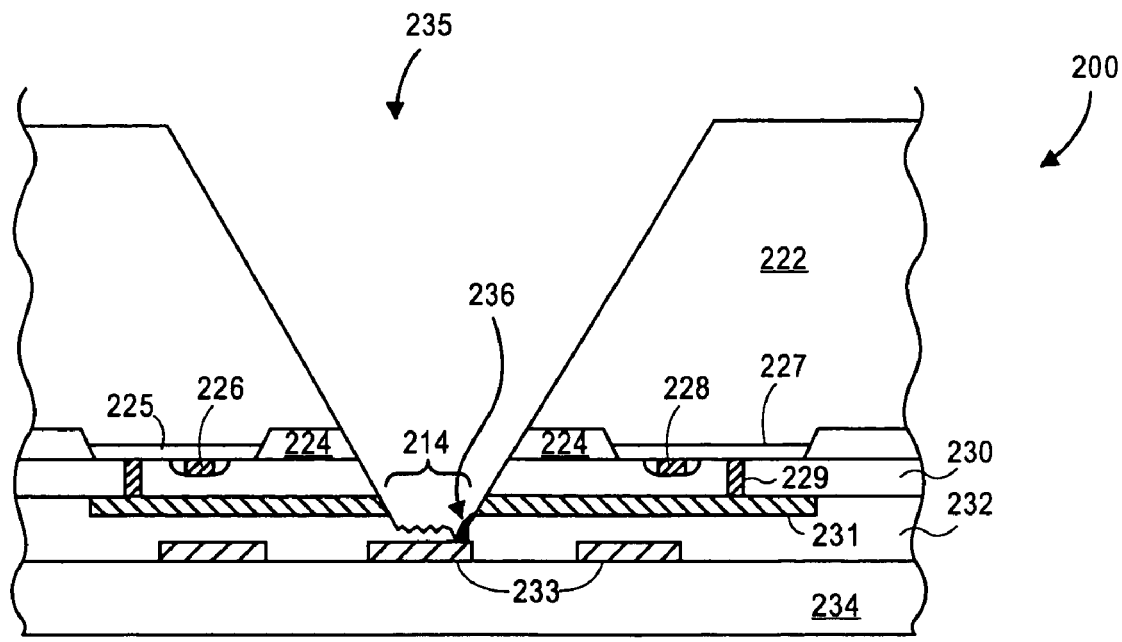
FIG. 2 illustrates a cross-sectional view of a circuit edit being performed on an integrated circuit.

It will be appreciated that for simplicity and clarity of illustration, elements in the drawings have not necessarily been drawn to scale. For example, the dimensions of some of the elements may be exaggerated relative to other elements for clarity. Where considered appropriate, reference numerals have been repeated among the drawings to indicate corresponding or analogous elements.

DETAILED DESCRIPTION

In the following detailed description, a modifiable circuit structure is disclosed. Reference is made to the accompanying drawings within which are shown, by way of illustration, specific embodiments by which the present invention may be practiced. It is to be understood that other embodiments may exist and that other changes may be made without departing from the scope and spirit of the present invention.

The terms on, above, below, and adjacent as used herein refer to the position of one layer or element relative to other layers or elements. As such, a first element disposed on, above, or below a second element may be directly in contact with the second element or it may include one or more intervening elements. In addition, a first element disposed next to or adjacent a second element may be directly in contact with the second element or it may include one or more intervening elements.

In accordance with one embodiment, a modifiable circuit structure is formed in or on portions of a semiconductor substrate. The position of the modifiable circuit structure is typically closer to the bulk semiconductor substrate than a M1 interconnect level and/or it can be formed of a material that is different from that of the M1 interconnects. The modifiable circuit structure can function as a conductive bridge between metal interconnect segments and thereby provides a supplemental medium for signal transmission between adjacent circuitry. This supplemental medium is more easily volatilized as compared to prior art copper structures and it can be removed with greater selectivity to adjacent materials. The modifiable circuit structure's proximity to the bulk semiconductor substrate, its increased selectivity, and its ability to be fully volatilized improves editing/cut success rates, throughput, and it enables the placement of a higher density of modifiable circuit structures into integrated circuit designs.

Figure 3:
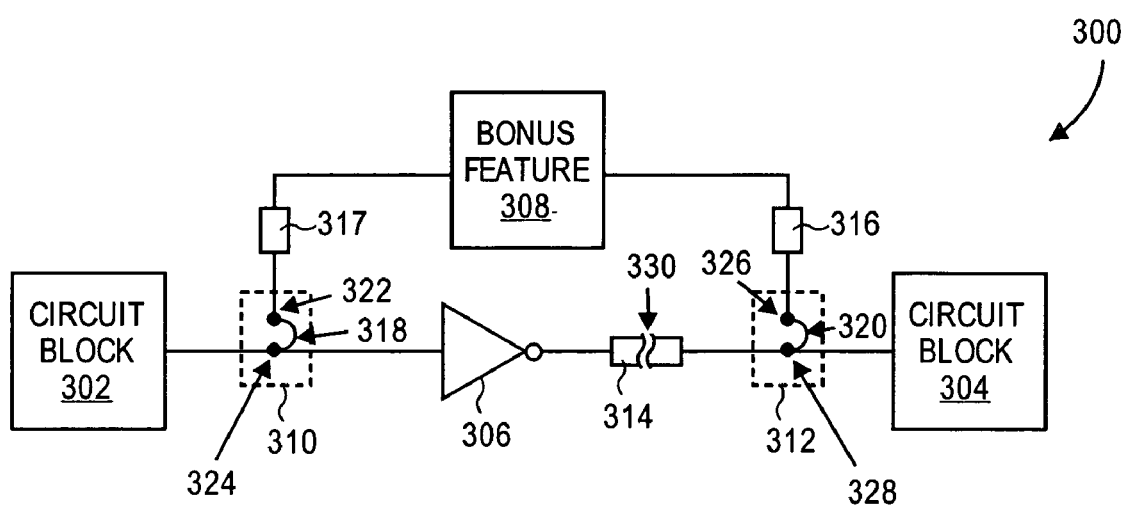
FIG. 3 illustrates schematic representation of a circuit edit being performed on an integrated circuit in accordance with an embodiment of the present invention.

Shown in FIG. 3 is schematic representation of a circuit edit performed on an integrated circuit 300 in accordance with one embodiment of the present invention. Here, during the debug process it was determined that the output of circuit block 302, which is coupled to circuit block 304 by way of inverter 306, should not be inverted when received by circuit block 304. So, using one or more of the embodiments herein, IC 300 can be edited by forming a discontinuity 330 (i.e., an electrical open or cut) in the modifiable circuit structure 314 that decouples the output of inverter 306 from the input of circuit block 304. Unlike the prior art, which forms the open in a M1 interconnect, embodiments of the present invention form the open 330 in a discrete structure 314 separate and/or apart from the M1 interconnect.

To the extent that bonus features 308 (bonus lines and bonus cells) exist in the IC 300, they can be added by depositing conductors 318 and 320 at points 310 and 312 respectively to electrically connecting them to the signal line. Similarly, to the extent that it is determined that bonus features must be removed from the IC 300, modifiable circuit structures 316 and/or 317 (similar to that of modifiable structure 314) can be cut to remove all or part of the bonus feature from the IC 300. In addition, the modifiable circuit structures described herein can be connected in series with inputs to a bonus feature designed in to an IC so as to provides a conductive path for at least one of VCC and VSS to hold an input of the bonus feature high or low, as the case may be thereby keeping it out of tri-state mode and preventing it from impacting the operation of other IC circuitry. Then later if it is determined that the bonus feature should be incorporated into the IC, the modifiable circuit structure can be cut to allow for normal operation of the bonus feature. For the purpose of this specification, bonus features are uncommitted logic elements and interconnects that exist in the IC to aid in design verification and to fix bugs but which are not used unless the need arises.

Figure 4A:
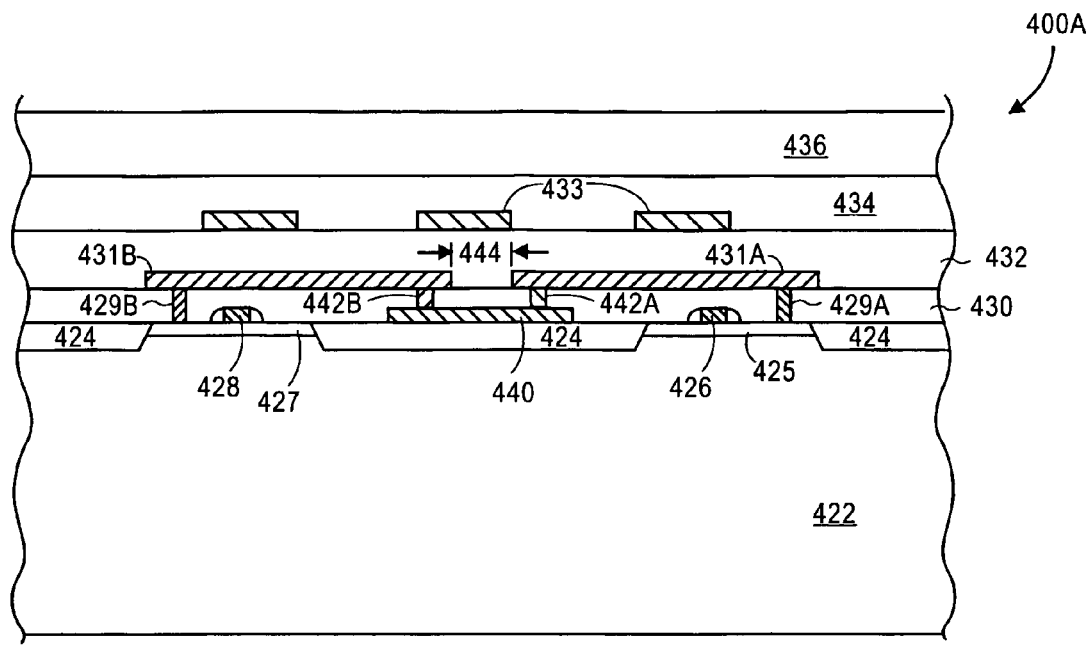
FIG. 4A illustrates a cross-sectional view of an integrated circuit having a modifiable circuit structure in accordance with an embodiment of the present invention.

Turning now to FIG. 4A, a cross-sectional view is shown illustrating an integrated circuit 400A having a modifiable circuit structure 440 in accordance with one embodiment of the present invention. Here, the modifiable circuit structure 440 could be representative of the modifiable circuit structure 314 in FIG. 3. As shown in FIG. 4A, the modifiable circuit structure 440 can be formed indirectly on semiconductor substrate 422. The semiconductor substrate 422 can be a monocrystalline semiconductor substrate, such as a silicon substrate. Or, alternatively, the semiconductor substrate 422 can be a compound semiconductor substrate, a silicon-on-insulator substrate or any other substrate used in the manufacture of semiconductor devices.

Trench isolation regions 424 or the like are formed on/in the semiconductor substrate. The trench isolation regions 424 can be used, among other things, to isolate source/drain 425 and 427 from each other. Transistors 426 and 428 overlie source/drain regions 425 and 427, respectively. Transistor 426 is cooperatively coupled to transistor 428 by way of source/drain region 425, via 429A, M1 interconnect 431A, via 442A, modifiable circuit structure 440, via 442B, M1 interconnect 431B, via 429B and source/drain region 427. Here source/drain region 425 could correspond to the output of inverter 306 (shown in FIG. 3) and source/drain region 427 can correspond to the input of circuit block 304 (shown in FIG. 3).

In accordance with one embodiment, modifiable circuit structure 440 can be deposited, patterned, and/or etched concurrently with the formation of gates for transistors 426 and 428. In one embodiment, the modifiable circuit structure 440 is formed from polysilicon. In alternative embodiments, the modifiable circuit structure can be formed from (1) silicon materials such as epitaxial silicon, amorphous silicon, and/or silicides; (2) metal-containing materials such as aluminum, (3) refractory metal-containing materials such as titanium, titanium nitride, tantalum, tantalum nitride, tungsten, tungsten nitride, molybdenum, molybdenum nitride; and (4) noble metal-containing material or metal material capable of forming conductive metal oxide, such as platinum, palladium, osmium, ruthenium, iridium oxide, ruthenium oxide, or the like. In addition, combinations of the foregoing materials can be used to form the modifiable circuit structure 440. One of ordinary skill appreciates that for the purposes of functioning as a modifiable circuit structure (i.e., being able to be cut/milled with a FIB-induced/enhanced chemical etch process) materials that are more easily volatilized may be preferable over materials that are less easily volatilized.

As shown in FIG. 4A, the modifiable circuit structure 440 can be formed indirectly on the semiconductor substrate 422 (i.e. it can be formed over the isolation region 424), however this is not necessarily a requirement of the present invention. The modifiable circuit structure 440 can alternatively be formed directly on the semiconductor substrate 422 or on an intervening layer or structure, such as for example a gate oxide layer (not shown) formed on (or over) the semiconductor substrate 422.

Overlying transistors 426 and 428 and circuit modifiable structure 440 is a dielectric layer 430. M1 interconnects 431A and 431B overlie the dielectric layer 430. M1 interconnects 431 A and B are coupled to source/drain regions 425 and 427 by way of vias 429A and 429B through the dielectric layer 430. In accordance with one embodiment, M1 interconnect 431 couples to modifiable circuit structure 440 by way of vias 442. Unlike conventional methods and structures which simply use a continuous M1 interconnect as the modifiable structure, embodiments of the present invention incorporate a discontinuity 444 in M1 interconnect 431 in conjunction with a separate modifiable circuit structure 440 and vias 442 to form the signal route between interconnected circuit elements (here, source/drains 425 and 427).

Overlying M1 interconnects 431 A and B is interlayer dielectric 432. Second level (M2) interconnects 433 can couple with M1 interconnect 431 by way of vias (not shown) through interlayer dielectric 432. Overlying M2 interconnects 433 can be an interlayer dielectric 434. And, overlying (or within) interlayer dielectric 434 is layer 436, which can include any number of IC elements, such as for example, additional interconnects, interlayer dielectrics, vias, passivation, bond pads, etc., used to fabricate an integrated circuit. One of ordinary skill appreciates that for purposes of practicing embodiments herein, the use of elements such as interlayer dielectric 432, M2 interconnects 433, interlayer dielectric 434, and additional circuit elements 436, is optional.

Figure 4B:
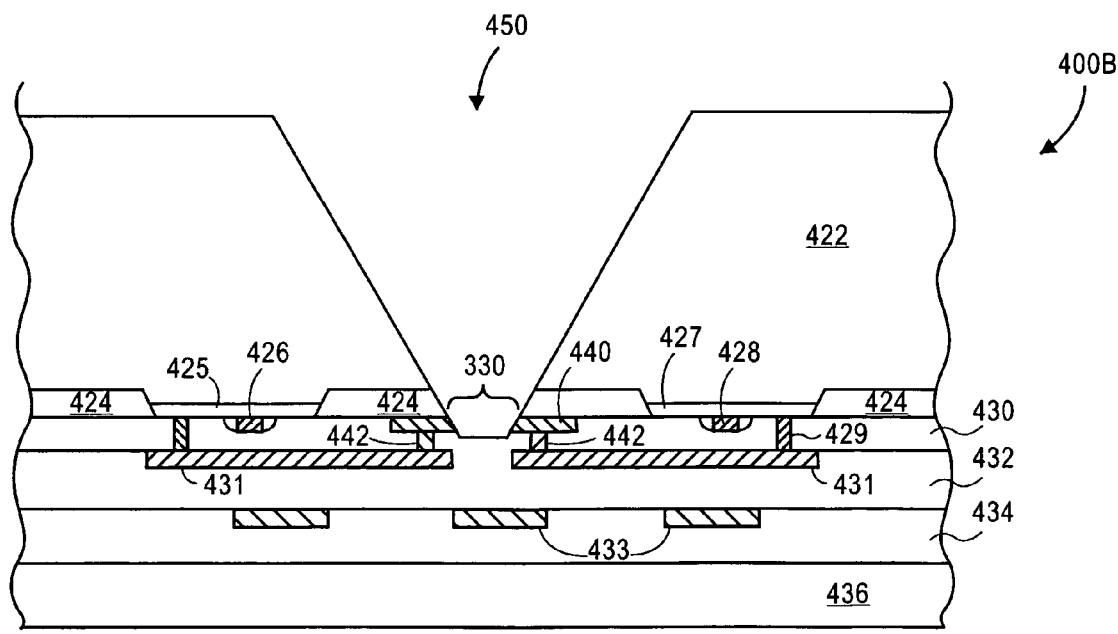
FIG. 4B illustrates a cross-sectional view of a circuit edit being performed on the modifiable circuit structure of FIG. 4A.

A process for editing the modifiable circuit structure of FIG. 4A will now be described with reference to FIG. 4B. In one embodiment, an electrical open is formed in the signal path between transistors 426 and 428 by first forming a window opening through the back side (i.e., the semiconductor substrate 422 side) of the integrated circuit 400A and then removing portions of the modifiable circuit structure 440 (and any intervening material, if present) through the window. FIG. 4B, shows the integrated circuit 400A after forming an window 450 through bulk portions of the semiconductor substrate 422 and then removing portions of the modifiable circuit structure 440 thereby forming an electrical open 330 between transistors 426 and 428. Note that for the purposes of ease and discussion, FIG. 4B, has been inverted as compared to FIG. 4A and is now designated as IC 400B.

In one embodiment, in order to cut the modifiable circuit structure 440, the IC 400B can first be globally thinned (not shown) by removing portions of substrate 442 prior to forming the window 450. In one embodiment, the IC 400B is globally thinned to a thickness of approximately 200 microns using well known techniques, such as for example mechanical polishing, mechanical machining, chemical etching or the like. Global thinning is not necessarily a requirement of the present invention. However, it can improve throughput of the editing operation by reducing the amount of material that must be removed during the formation of window 450. In an alternative embodiment, instead of global thinning, the substrate could instead be locally thinned in regions proximate to the modifiable circuit structure.

After the semiconductor substrate 422 is thinned, portions of the semiconductor substrate 422 proximate the modifiable circuit structure 440 (i.e., portions adjacent the modifiable circuit structure 440) are removed to form the window 450. In one embodiment, portions are removed using well known milling techniques, such as for example using a FIB milling tool to perform a FIB induced or FIB assisted chemical etch.

Generally, in the FIB induced chemical etch, gas chemistries are first introduced in close proximity to the desired circuit edit area so they can adsorb onto the backside of the silicon substrate (bulk silicon substrate side). The focused ion beam then rasters over regions of the semiconductor substrate (or other underlying regions exposed during the milling process) where the etching is to occur. The energy provided by the FIB's primary ions and/or secondary particles (electrons and ions coming off the substrate surface) provide the energy required to induce a surface chemical reaction and thereby removes the material being milled/etched. Selectivity to various layers exposed during the milling process can be controlled by introducing specific chemistries that are more or less reactive with one type of material over another. The FIB assisted chemical etch process is similar to the above process except that instead of just adsorbing on the backside surface of the semiconductor substrate, the chemistries are capable of spontaneously etching the substrate material (or other underlying regions exposed during the milling process) on its own. Here, the FIB can enhance the removal rate, directionality (anisotropy), and selectivity of the etch.

In embodiments where the modifiable circuit structure is formed over a trench isolation region, such as here, milling/removal continues until portions of the trench isolation material 424 are removed and then until an electrical open 330 is formed in modifiable circuit structure 440. The electrical open 330 shown in FIG. 4B can correspond with the discontinuity 330 shown in FIG. 3.

Upon forming the electrical open 330, the signal path has been broken and the source/drains 425 and 427 have been isolated from each other. It is worth nothing that at this point in the process, windows corresponding to points 322, 324 and 326, 328 (FIG. 3) can also be milled and conductive jumpers 318 and 320 (FIG. 3) can be deposited to integrate the use of bonus features 308 (FIG. 3), if so desired.

Figure 5A:
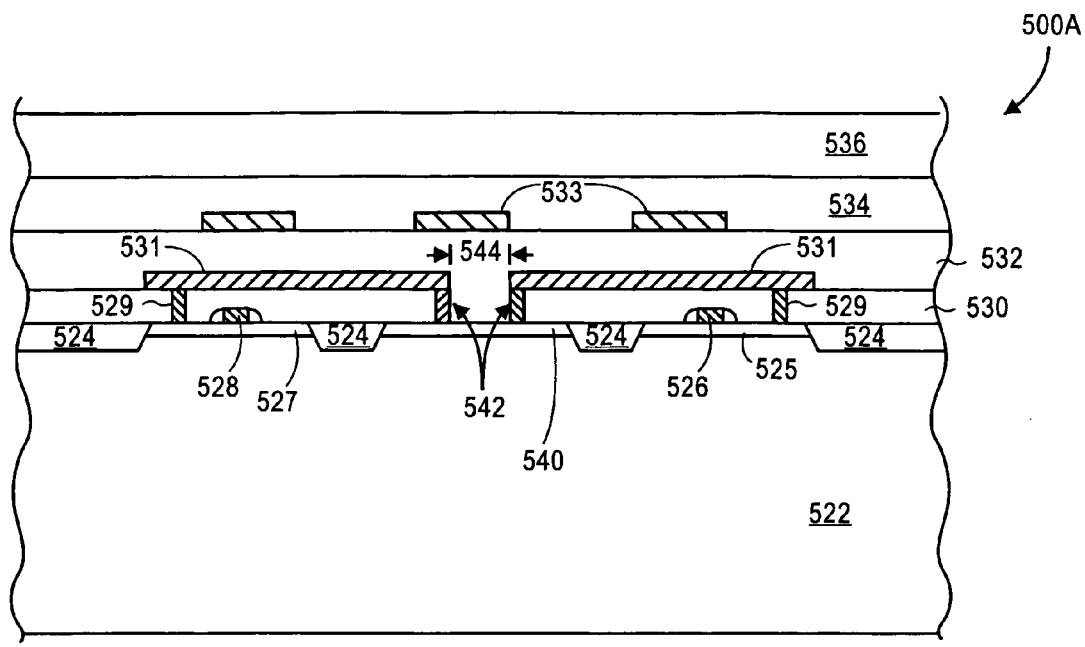
FIG. 5A illustrates a cross-sectional view of an integrated circuit having a modifiable circuit structure in accordance with an embodiment of the present invention.

FIG. 5A shows an alternative embodiment of the present invention wherein the modifiable circuit structure 540 is formed as a diffusion region 540 in the semiconductor substrate 522. For the purposes of simplicity, unnecessary repetitive discussion of elements 522, 524 525, 526, 527, 528, 530, 529, 532, 533, 534, and 536 of FIG. 5A, which are functionally equivalent to elements 422, 424 425, 426, 427, 428, 429, 430, 432, 433, 434, and 536 of FIG. 4A, will be omitted. As shown in FIG. 5A, the modifiable circuit structure 540 is a diffusion region formed between isolation regions 524. The diffusion region 540 can be formed as a tap or diode diffusion region and at approximately the same time source/drain regions 527 and 528 are formed. The diffused modifiable circuit structure 540 should be doped so that it is highly conductive. Conductivity can additionally be increased by siliciding the diffused modifiable circuit structure 540.

As shown in FIG. 5A, M1 interconnects 531 are coupled to source/drain regions 525 and 527 by way of vias 529 through the dielectric layer 430. In accordance with one embodiment, M1 interconnect 531 couples to modifiable circuit structure 540 by way of vias 542. Unlike conventional methods and structures which simply use a continuous M1 interconnect as the modifiable structure, embodiments of the present invention incorporate a discontinuity 544 in M1 interconnect 531 in conjunction with the separate diffused modifiable circuit structure 540 and vias 542 to form the signal route between interconnected circuit elements (i.e. source/drains 225 and 427).

Figure 5B:
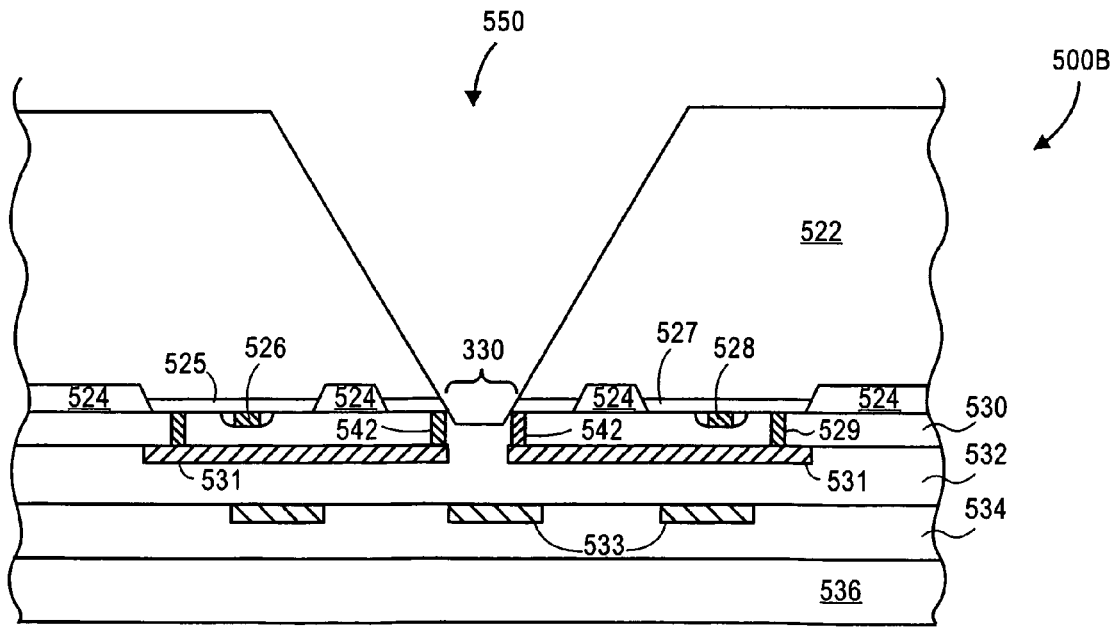
FIG. 5B illustrates a cross-sectional view of a circuit edit being performed on the modifiable circuit structure of FIG. 5A.

A process for editing the modifiable circuit structure of FIG. 5A will now be discussed with reference to FIG. 5B. In one embodiment, an electrical open 330 is formed in the signal path between transistors 526 and 528 by first (1) forming an opening through the back side (i.e., the semiconductor substrate 522 side) of the integrated circuit 500B and (2) then removing portions of the diffused modifiable circuit structure 540 (and any intervening material, if present) through the opening 550. FIG. 5B, shows the integrated circuit 500B after forming window 550 through bulk portions of the semiconductor substrate 522 and removing portions of the modifiable circuit structure 540, thereby forming an electrical open 330 between transistors 526 and 528. Note that the IC 500B of FIG. 5B, has been inverted as compared to the IC 500A of FIG. 5A.

Similar to the embodiment discussed with respect to FIG. 4B, this embodiment contemplates global thinning of portions of semiconductor substrate 522 prior to forming the window opening 550. So, in one embodiment, the IC 500B can be globally thinned to a thickness of approximately 200 microns using well known techniques, such as for example mechanical polishing, mechanical machining, chemical etching or the like prior to forming the window opening 550. As stated previously, global (or local) thinning is not necessarily a requirement of the present invention. However, it can improve throughput of the editing operation by reducing the amount of semiconductor material that must be removed in order to form window 550.

After the substrate 522 is thinned, portions of the semiconductor substrate 522 proximate the modifiable circuit structure 540 are removed to form the window 550. In one embodiment, portions are removed using well known milling techniques, such as for example using a FIB milling tool to perform a FIB induced or FIB assisted chemical etch (similar to that described with respect to FIG. 4B). Milling/removal continues until portions of the diffused modifiable circuit structure 540 are removed and an electrical open 330 is formed. The electrical open 330 shown in FIG. 5B can correspond with the discontinuity 330 shown in FIG. 3. Upon forming the electrical open 330, the signal path between transistors 526 and 528 has been broken and the circuits have been isolated from each other.

Figure 6A:
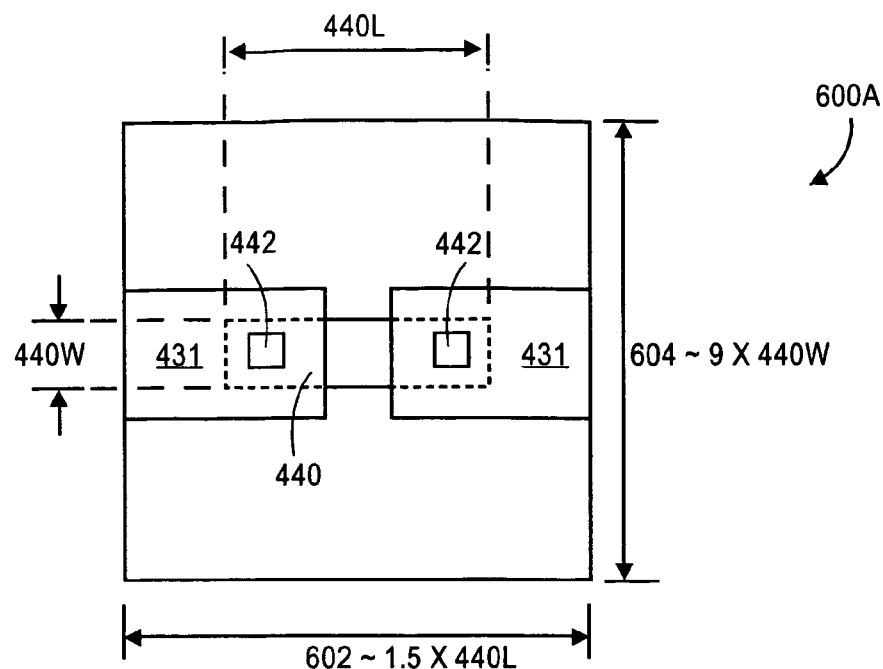
FIG. 6A illustrates a top-down layout view of the modifiable circuit structure of FIGS. 4A and 4B.
Figure 6B:
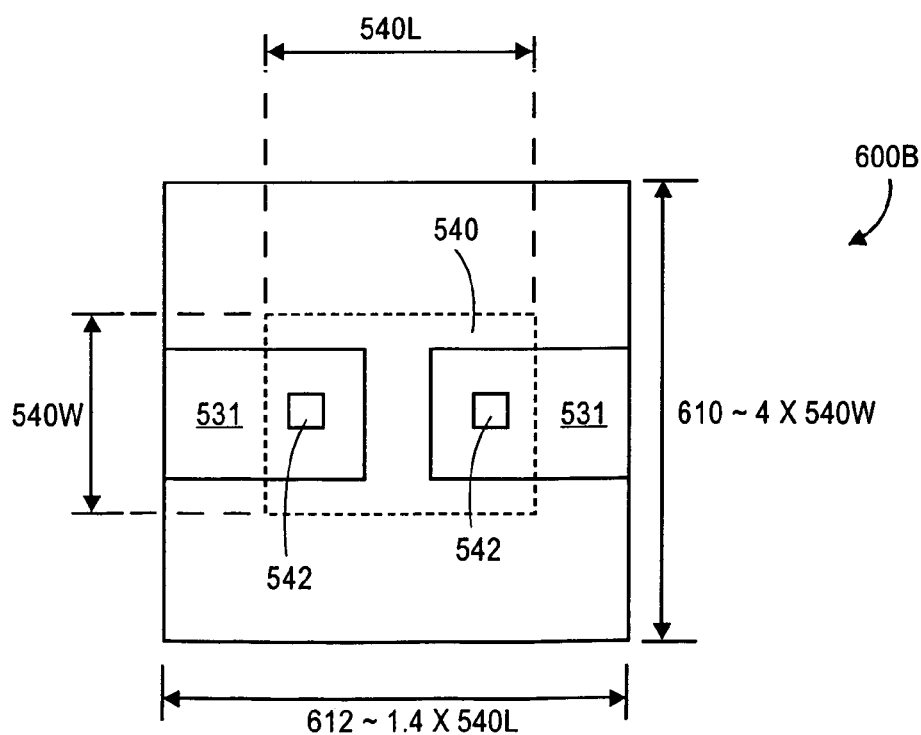
FIG. 6B illustrates a top-down layout view of the modifiable circuit structure of FIGS. 5A and 5B.

To the extent that the modifiable circuit structures disclosed herein are formed adjacent other circuitry in the IC, it has been determined that the modifiable circuit structures should be confined to areas that exclude the formation of other active area circuitry. These areas, termed keep out areas, can be used (1) to facilitate the design in of modifiable circuit structures that can be used to isolate IC circuitry, (2) to facilitate impeding signal transmissions at key designed in layout points within an IC, and (3) to design in bonus features (and other designed in experiments) by providing predetermined layout requirements that will enable fast and easy line cutting with a FIB during debug. FIGS. 6A and 6B illustrate relative dimensions for keep out areas for the embodiments discussed with respect to FIGS. 4A/4B and 5A/5B respectively.

Turning now to FIG. 6A, a keep out area 600A for the modifiable circuit structure 440 (FIGS. 4A/4B) is shown. As shown in FIG. 6A, for a polysilicon (or the like) modifiable circuit structure 440 (centered in the keep out area 600A) having a width 440W and a length 440L, the width dimension 604 of the keep out area 600A can be approximately nine times that of the width dimension 440W of the modifiable circuit structure 440, and the length dimension 602 of keep out area 600A can be approximately 1.5 times that of the length dimension 440L of the modifiable circuit structure 440.

Turning now to FIG. 6B, a keep out area 600B for the modifiable circuit structure 540 (FIGS. 5A/5B) is shown. As shown in FIG. 6B, for a diffused modifiable circuit structure 540 (centered in the keep out area 600B) having a width 540W and a length 540L, the width dimension 610 of the keep out area 600B can be approximately four times that of the width dimension 440W of the modifiable circuit structure 440, and the length dimension 602 of keep out area 600B can be approximately 1.4 times than that of the length dimension 440L of the modifiable circuit structure 440.

In the various embodiments discussed herein modifiable circuit structures, their use in integrated circuits and methods for cutting them have been disclosed. Embodiments of the present invention can advantageously be used to facilitate IC debugging processes and thereby expedite mass production of optimized IC products. As disclosed herein, modifiable circuit structures (diffusion (tap or diode) regions or field poly structures) of a given dimension can be disposed in keep out areas and placed in series with a given signal line or within a design cell (e.g. bonus cell inputs) in order to enable signal cutting through a silicon substrate backside with a FIB, or the like. In one embodiment, the modifiable circuit structure can be placed in series between interconnecting circuits so as to provide the option of removing circuits from the IC. In an alternative embodiment, the modifiable circuit structure can be placed in series between the input pin of a bonus device (e.g., a bonus NAND gate) and VCC or VSS to hold the input pin's logic state high or low, thereby preventing the bonus device from being in a tri-state and impacting the operation of other interconnected circuitry while not being used by the IC. The modifiable circuit structures disclosed herein can advantageously be used in clock cells, bonus cells, and in deterministic experiments to ensure accessibility and FIB-ability of such cells through the silicon backside.

Embodiments of the present invention overcome the prior art problems encountered when using M1 cut constructs as modifiable circuit structures. That is, unlike prior art copper metal lines which do not volatilize easily, the diffusion resistor and/or field poly modifiable circuit structures disclosed herein can be fully volatilized during FIB milling. Selectivity to the FIB milling process is thereby improved as well as the FIB cut success rate and throughput. Moreover, modifiable circuit structures disclosed can easily be designed in to existing mask layouts and the structures themselves can be fabricated on semiconductor substrates using existing processing technologies with minimal/no added processing steps being required.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A method for editing an integrated circuit comprising:
   forming a window through bulk semiconductor regions of a semiconductor substrate, the window exposing a modifiable circuit structure, the modifiable circuit structure connecting at least a first interconnect with at least a second interconnect; and
   forming a discontinuity in the modifiable circuit structure, wherein the modifiable circuit structure comprises a conductive material that is different from a material used to form the interconnects in the integrated circuit.

2. The method of claim 1, wherein the modifiable circuit structure is further characterized as a polysilicon-containing modifiable circuit structure.

3. The method of claim 2, wherein the modifiable circuit structure is formed concurrently with the formation of gate electrodes used by the integrated circuit.

4. The method of claim 2, wherein the modifiable circuit structure overlies an isolation region of the integrated circuit.

5. The method of claim 2, wherein the modifiable circuit structure overlies an active area of the integrated circuit.

6. The method of claim 1, wherein the modifiable circuit structure comprises a material selected from the group consisting of epitaxial silicon, amorphous silicon, refractory silicides, refractory metals, aluminum, conductive nitrides, conductive oxides, and alloys thereof.

7. The method of claim 1, wherein the modifiable circuit structure is electrically connected to integrated circuit interconnects by way of vias, and wherein prior to forming the discontinuity, a combination of the interconnects, the vias, and the modifiable circuit structure forms an uninterrupted medium for transmitting signals between adjacent integrated circuit circuitry.

8. The method of claim 1, wherein the modifiable circuit structure is further characterized as a diffused region in portions of a semiconductor substrate.

9. The method of claim 8, wherein the diffused region is one of a tap diffused region or diode diffused region.

10. The method of claim 8, wherein the diffused region is silicided.

11. The method of claim 1, wherein prior to forming a discontinuity in the modifiable circuit structure, semiconductor substrate portions of the integrated circuit are first thinned.

12. The method of claim 11, wherein the window exposing a modifiable circuit structure is formed using a focused ion beam milling process.

13. The method of claim 12, wherein the modifiable circuit structure is confined to within a keep out area associated with the integrated circuit.

14. A method for editing an integrated circuit comprising:
  forming a window through bulk semiconductor regions of a semiconductor substrate, the window exposing a modifiable circuit structure; and
  forming a discontinuity in the modifiable circuit structure, wherein the modifiable circuit structure comprises a conductive material that is different from a material used to form interconnects in the integrated circuit,
  wherein the modifiable circuit structure is formed concurrently with the formation of gate electrodes used by the integrated circuit.

15. The method of claim 14, wherein the modifiable circuit structure is further characterized as a polysilicon-containing modifiable circuit structure.

16. The method of claim 15, wherein the modifiable circuit structure overlies an isolation region of the integrated circuit.

17. The method of claim 15, wherein the modifiable circuit structure overlies an active area of the integrated circuit.

18. The method of claim 14, wherein the modifiable circuit structure comprises a material selected from the group consisting of epitaxial silicon, amorphous silicon, refractory silicides, refractory metals, aluminum, conductive nitrides, conductive oxides, and alloys thereof.

19. The method of claim 14, wherein the modifiable circuit structure is electrically connected to integrated circuit interconnects by way of vias, and wherein prior to forming the discontinuity, a combination of the interconnects, the vias, and the modifiable circuit structure forms an uninterrupted medium for transmitting signals between adjacent integrated circuit circuitry.

20. The method of claim 14, wherein the modifiable circuit structure is further characterized as a diffused region in portions of a semiconductor substrate.

21. The method of claim 20, wherein the diffused region is one of a tap diffused region or diode diffused region.

22. The method of claim 20, wherein the diffused region is silicided.

23. The method of claim 14, wherein prior to forming a discontinuity in the modifiable circuit structure, semiconductor substrate portions of the integrated circuit are first thinned.

24. The method of claim 23, wherein the window exposing a modifiable circuit structure is formed using a focused ion beam milling process.

25. The method of claim 24, wherein the modifiable circuit structure is confined to within a keep out area associated with the integrated circuit.

* * * * *